United States Patent
Razeghi

(10) Patent No.: US 11,417,523 B2
(45) Date of Patent: Aug. 16, 2022

(54) AMPHOTERIC P-TYPE AND N-TYPE DOPING OF GROUP III-VI SEMICONDUCTORS WITH GROUP-IV ATOMS

(71) Applicant: Northwestern University, Evanston, IL (US)

(72) Inventor: Manijeh Razeghi, Wilmette, IL (US)

(73) Assignee: Northwestern University, Evanston, IL (US)

( * ) Notice: Subject to any disclaimer, the term of this patent is extended or adjusted under 35 U.S.C. 154(b) by 153 days.

(21) Appl. No.: 16/771,604

(22) PCT Filed: Jan. 23, 2019

(86) PCT No.: PCT/US2019/014650
§ 371 (c)(1),
(2) Date: Jun. 10, 2020

(87) PCT Pub. No.: WO2019/147602
PCT Pub. Date: Aug. 1, 2019

(65) Prior Publication Data
US 2020/0312660 A1    Oct. 1, 2020

Related U.S. Application Data

(60) Provisional application No. 62/623,183, filed on Jan. 29, 2018.

(51) Int. Cl.
*H01L 21/02* (2006.01)
*H01L 29/24* (2006.01)
(Continued)

(52) U.S. Cl.
CPC .... *H01L 21/02579* (2013.01); *H01L 21/0262* (2013.01); *H01L 21/02565* (2013.01);
(Continued)

(58) Field of Classification Search
CPC .......... H01L 21/02521; H01L 21/0254; H01L 21/02554; H01L 21/02565;
(Continued)

(56) References Cited

U.S. PATENT DOCUMENTS 3,600,240 A    8/1971 Rupprecht et al.
3,676,228 A    7/1972 Sakurai et al.
(Continued)

FOREIGN PATENT DOCUMENTS

EP    0090521 A2    3/1982

OTHER PUBLICATIONS

The International Search Report & Written Opinion issued in International Patent Application No. PCT/US20/16028 dated May 18, 2020, pp. 1-7.

(Continued)

*Primary Examiner* — Cheung Lee
(74) *Attorney, Agent, or Firm* — Bell & Manning, LLC

(57) ABSTRACT

Methods of forming a p-type IV-doped III-VI semiconductor are provided which comprise exposing a substrate to a vapor composition comprising a group III precursor comprising a group III element, a group VI precursor comprising a group VI element, and a group IV precursor comprising a group IV element, under conditions to form a p-type IV-doped III-VI semiconductor via metalorganic chemical vapor deposition (MOCVD) on the substrate. Embodiments make use of a flow ratio defined as a flow rate of the group VI precursor to a flow rate of the group III precursor wherein the flow ratio is below an inversion flow ratio value for the IV-doped III-VI semiconductor.

24 Claims, 10 Drawing Sheets

VI/III ratio

(51) Int. Cl.
*H01L 31/032* (2006.01)
*H01L 31/18* (2006.01)
*H01L 33/00* (2010.01)
*H01L 33/26* (2010.01)

(52) U.S. Cl.
CPC .......... *H01L 29/24* (2013.01); *H01L 31/0321* (2013.01); *H01L 31/18* (2013.01); *H01L 33/005* (2013.01); *H01L 33/26* (2013.01)

(58) Field of Classification Search
CPC ......... H01L 21/02579; H01L 21/02617; H01L 21/18; H01L 29/12; H01L 29/20; H01L 29/2003; H01L 29/24; H01L 29/26; H01L 29/267; H01L 31/0248; H01L 31/0264; H01L 31/028; H01L 31/032; H01L 31/0321; H01L 31/109; H01L 31/18; H01L 31/1876; H01L 33/005; H01L 33/02; H01L 33/26; H01L 21/0262; C30B 29/10; C30B 29/38; C30B 29/40; C30B 29/403
See application file for complete search history.

(56) References Cited

U.S. PATENT DOCUMENTS

| | | | |
|---|---|---|---|
| 4,035,205 A | 7/1977 | Lebailly et al. | |
| 4,583,110 A | 4/1986 | Jackson et al. | |
| 4,692,194 A | 9/1987 | Nishizawa | |
| 4,939,102 A | 7/1990 | Hamm et al. | |
| 5,268,582 A | 12/1993 | Kopf et al. | |
| 2006/0027814 A1 | 2/2006 | Watanabe et al. | |
| 2008/0092954 A1 | 4/2008 | Choi | |
| 2009/0231909 A1 | 9/2009 | Dieny et al. | |
| 2011/0186856 A1* | 8/2011 | Huang | H01L 33/30 257/76 |
| 2012/0267234 A1* | 10/2012 | Reece | C01B 3/042 204/157.5 |
| 2017/0077330 A1 | 3/2017 | Li et al. | |
| 2018/0197915 A1 | 7/2018 | Briggs et al. | |
| 2018/0254355 A1* | 9/2018 | Sasaki | C30B 23/02 |
| 2018/0287001 A1 | 10/2018 | Bedell et al. | |
| 2018/0308996 A1* | 10/2018 | Park | H01L 31/022425 |

OTHER PUBLICATIONS

Manijeh Razeghi et al., "A review of the growth, doping, and applications of β-$Ga_2O_3$ thin films," Proc. of SPIE vol. 10533, pp. 105330R-1-105330R-24.

Michael A. Mastro et al., "Opportunities and Future Directions for $Ga_2O_3$," ECS Journal of Solid State Science and Technology, vol. 6, No. 5, 2017, pp. P356-P359.

Kalpana Singh et al., "Amphoteric oxide semiconductors for energy conversion devices: a tutorial review," Chem. Soc. Rev., vol. 42, 2013, pp. 1961-1972.

The International Search Report & Written Opinion issued in International Patent Application No. PCT/US19/14650 dated Apr. 11, 2019, pp. 1-8.

Gang Niu, "Epitaxial systems and combining oxides and semiconductors," Molecular Beam Epitaxy, 2013, https://www.sciencedirect.com/topics/chemistry/metal-organic-chemical-vapor-deposition, p. 1.

* cited by examiner

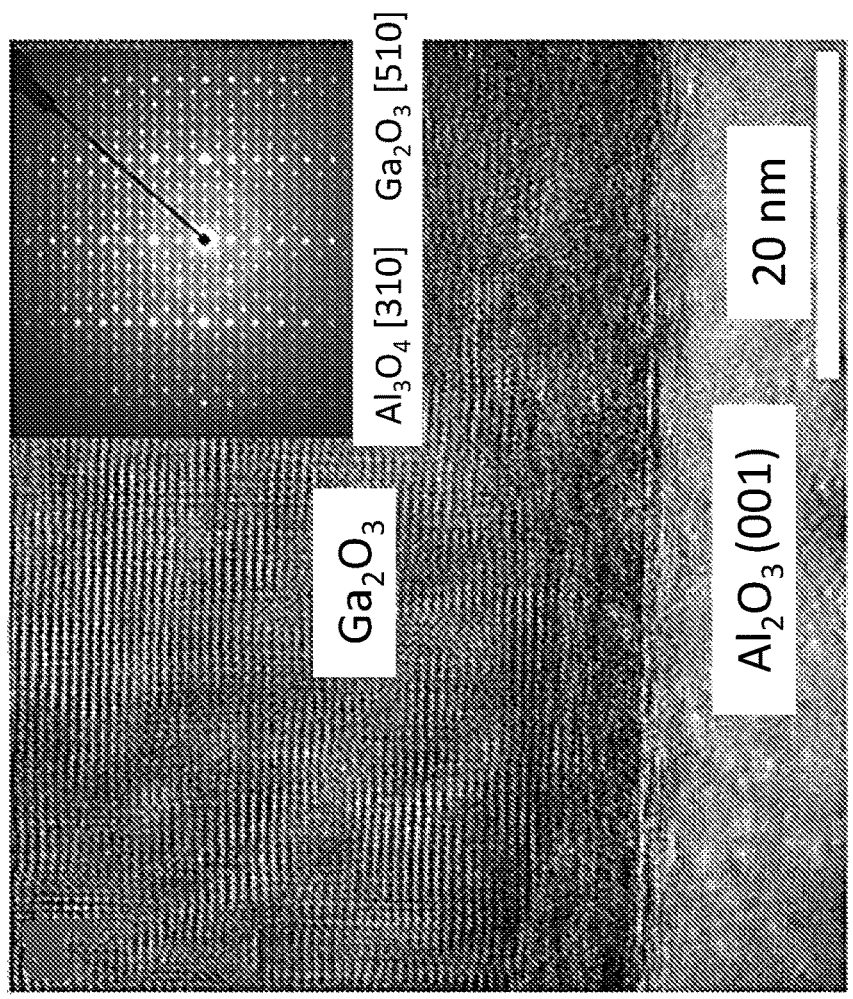
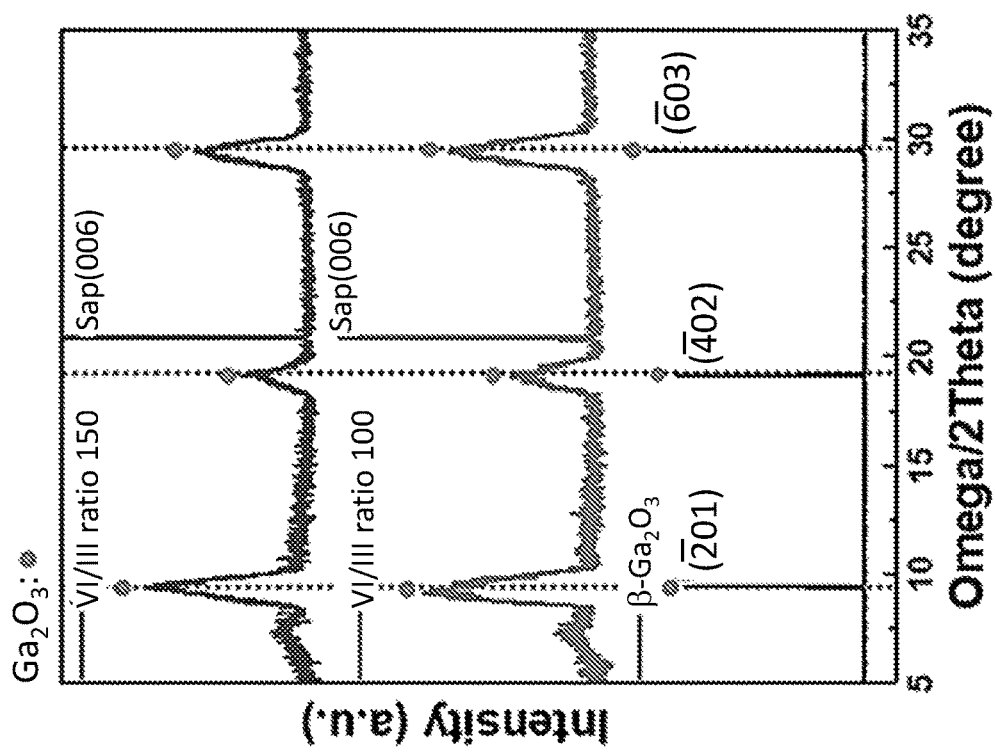
FIG. 4A
FIG. 4B

AMPHOTERIC P-TYPE AND N-TYPE DOPING OF GROUP III-VI SEMICONDUCTORS WITH GROUP-IV ATOMS

CROSS-REFERENCE TO RELATED APPLICATIONS

This application is a National Stage of International Application No. PCT/US2019/014650, filed Jan. 23, 2019, which claims the benefit of U.S. Patent Application No. 62/623,183, filed Jan. 29, 2018, the contents of each of which are herein incorporated by reference.

REFERENCE TO GOVERNMENT RIGHTS

This invention was made with government support under ECCS-1748339 awarded by the National Science Foundation. The government has certain rights in the invention.

BACKGROUND $(Al,In,Ga)_2O_3$ represents a newly developing III-VI family of semiconducting oxide materials. It holds great promise, but currently suffers from an inability to achieve effective p-type doping. The material is typically doped using silicon (Group-IV) to substitute for gallium (or aluminum or indium) to achieve a n-type material. Magnesium (Group-II) has been used to substitute for the same gallium (or aluminum or indium) to achieve a p-type material. However, this requires the addition of a separate magnesium source. In addition, magnesium exhibits a large memory effect in metalorganic chemical vapor deposition (MOCVD) growth which means it is difficult to obtain p-n heterojunctions where the p-type material is grown first.

SUMMARY

Provided are methods of forming IV-doped III-VI semiconductors, including p-type III-VI semiconductors doped with Si. Also provided are the IV-doped III-VI semiconductors and devices incorporating the IV-doped III-VI semiconductors.

In an aspect, methods of forming a p-type IV-doped III-VI semiconductor are provided which comprise exposing a substrate to a vapor composition comprising a group III precursor comprising a group III element, a group VI precursor comprising a group VI element, and a group IV precursor comprising a group IV element, under conditions to form a p-type IV-doped III-VI semiconductor via metalorganic chemical vapor deposition (MOCVD) on the substrate. Embodiments make use of a flow ratio defined as a flow rate of the group VI precursor to a flow rate of the group III precursor wherein the flow ratio is below an inversion flow ratio value for the IV-doped III-VI semiconductor.

In another aspect, a p-type IV-doped III-VI semiconductor is provided which comprises a group III element, a group VI element and a group IV element.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the present disclosure will hereafter be described with reference to the accompanying drawings.

FIG. 4A shows an XRD omega/2theta scan of ~150 nm thick $Ga_2O_3$:Si grown using a VI/III ratio of 150 (top), at a VI/III ratio of 100 (middle) and an XRD omega/2theta scan of a β-$Ga_2O_3$ substrate (TAMURA Corp) (bottom). FIG. 4B shows a TEM image of typical morphology of the ~150 nm thick $Ga_2O_3$:Si on sapphire. The inset shows SAED patterns obtained along the [5-10] zone axis at the κ-$Ga_2O_3$/$Al_2O_3$ interface.

DETAILED DESCRIPTION

Figures 1A, 1B:
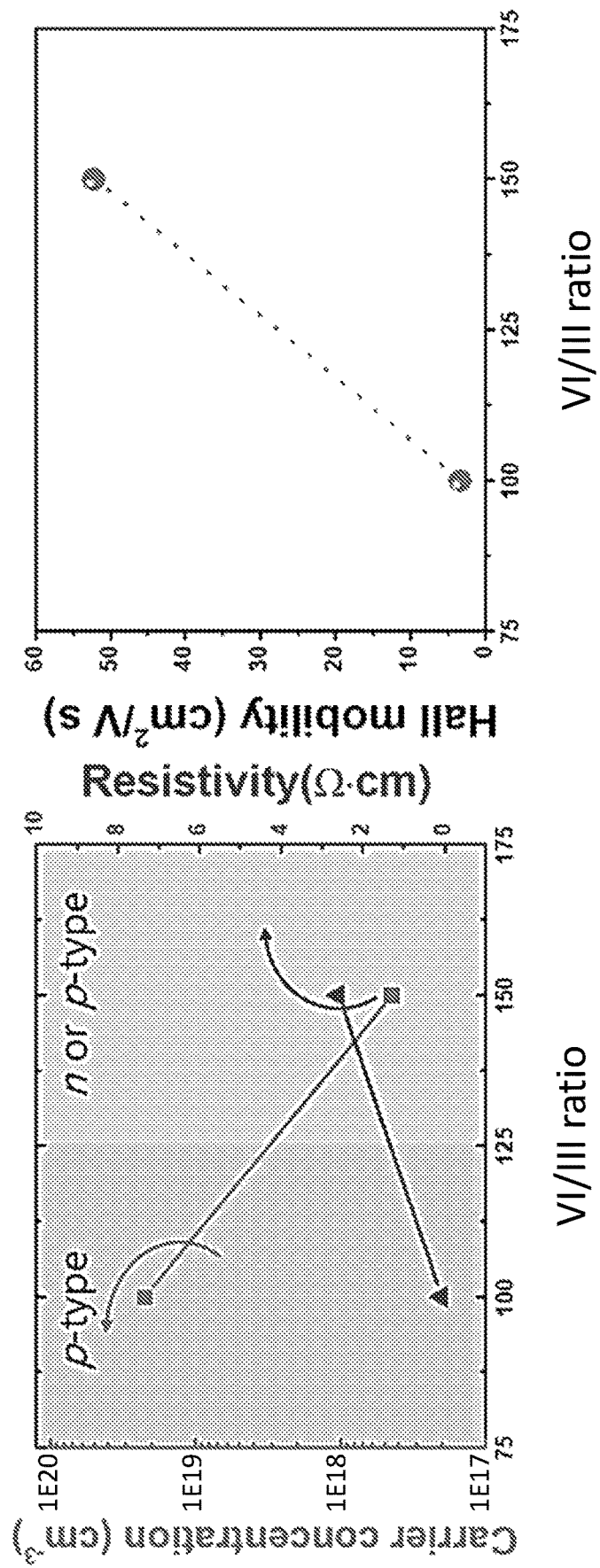
FIG. 1A shows a plot of carrier concentration as a function of VI-III flow ratio for $Ga_3O_2$:Si formed according to an illustrative embodiment.
FIG. 1B shows a plot of Hall mobility as a function of VI-III flow ratio for $Ga_3O_2$:Si formed according to an illustrative embodiment.

Provided are methods of forming IV-doped III-VI semiconductors, including p-type III-VI semiconductors doped with Si. Also provided are the IV-doped III-VI semiconductors and devices incorporating the IV-doped III-VI semiconductors.

The present methods are based on the technique of metalorganic chemical vapor deposition (MOCVD). As such, any reactor system suitable for carrying out MOCVD may be used to carry out the methods. An embodiment of a method of forming an IV-doped III-VI semiconductor comprises a step of exposing a substrate to a vapor composition comprising a group III precursor comprising a group III element, a group VI precursor comprising a group VI element, and a group IV precursor comprising a group IV element. The exposure takes place under conditions sufficient to form a compound semiconductor from the group III, group VI, and group IV precursors via MOCVD. That is, the group III, group VI, group IV precursors adsorb to the surface of substrate where they react to form the compound semiconductor, typically as a layer on the surface of the substrate. The method may include a predeposition step to form a wetting layer on the substrate prior to exposure to the vapor composition. The predeposition step may comprise exposing the substrate to the group III precursor (i.e., without the group VI precursor and without the group IV precursor).

The group III precursors are metalorganic compounds comprising a group III element. In embodiments, the group III element is selected from Ga, Al, and In. A variety of group III precursors may be used, e.g., trimethylgallium, trimethylaluminum, trimethylindium, triethylgallium, triethylaluminum, triethylindium, triisopropylgallium, triisopropylaluminum, triisopropylindium, triisobutylgallium, and triisobutylaluminum. In embodiments, a single group III precursor is used, e.g., a gallium-containing group III precursor to provide a Ga-group VI compound semiconductor. In embodiments, more than one group III precursor is used so as to facilitate alloying of the group III elements in the formation of the compound semiconductor. By of illustration, a gallium-containing group III precursor, an aluminum-containing group III precursor and an indium-containing group III precursor may be used to provide a GaAlIn-group VI compound semiconductor. In such a compound semiconductor, the ratios of Ga, Al, In may vary, depending upon the desired properties and application for the semiconductor. As another illustration, a gallium-containing group III precursor and an indium-containing group III precursor may be used to provide a Gain-group VI compound semiconductor. Again, in such a compound semiconductor, the ratios of Ga and In may vary.

The group VI precursors are compounds comprising a group VI element. In embodiments, the group VI element is O. A variety of group VI precursors may be used, e.g., water, oxygen, $N_2O$, and ozone.

The group IV precursors are compounds comprising a group IV element. In the present methods, the group IV precursors are used as dopants, i.e., to provide an IV-doped III-VI. In embodiments, the group IV element is Si. A variety of group IV precursors may be used, e.g., $SiH_4$, tetraethylorthosilicate, $Si_2H_6$, $SiCl_4$.

Because one or more of the group III, group VI, and group IV precursors may be provided in a carrier gas (e.g., $N_2$, Ar, $H_2$), the vapor composition may also comprise one or more such carrier gases.

By "conditions" as that term is used with respect to the present methods, refers to the growth temperature, the pressure of the vapor composition, the flow ratio of the group VI precursor to the group III precursor, and the carrier gas. The present methods are based, at least in part, on the finding that certain of these conditions may be adjusted to tune the doping type of the compound semiconductor from n-type to p-type, even when using the same dopant, i.e., the same group IV precursor. That is, certain of these conditions may be adjusted so that the group IV element of the group IV precursor substitutes for the group VI element in the forming compound semiconductor to provide a p-type IV-doped III-VI semiconductor or so that the group IV element substitutes for the group III element to provide an n-type IV-doped III-VI semiconductor.

These findings are particularly surprising given the widely accepted challenges in the field for obtaining p-type III-VI semiconductors such as p-type $Ga_2O_3$. Specifically, for p-type $Ga_2O_3$ thin films, shallow donor level (due to oxygen vacancy) with low formation energy can influence the efficiency of doping and compensate for native acceptors. This requires high formation energy, which makes it difficult to grow the p-type material. See also Mastro et al., "Opportunities and Future Directions for $Ga_2O_3$," ECS Journal of Solid-State Science and Technology, 6 (5) p. 356-359 (2017), which provides additional evidence of these challenges.

By way of illustration, it has been found that the flow ratio of the group VI precursor to the group III precursor may be adjusted to provide both an n-type IV-doped III-VI semiconductor (at certain flow ratios) and a p-type IV-doped III-VI semiconductor (at other flow ratios) even when using the same group IV precursor. Similarly, an inversion flow ratio value has been found, below which value a p-type IV-doped III-VI semiconductor is formed and above which value a n-type IV-doped III-VI semiconductor is formed even when using the same group IV precursor. The inversion flow ratio value for a particular material system may be referenced at a particular growth temperature, pressure, and carrier gas being used in the method.

These findings are demonstrated in the Examples below using trimethylgallium (group III precursor), water (group VI precursor) and silane (group IV precursor) to provide both n-type $Ga_3O_2$:Si and p-type $Ga_3O_2$:Si simply by adjusting the flow ratio of the 0 precursor to the Ga precursor. In other words, it has been found that Si acts as an amphoteric dopant for $Ga_3O_2$ via adjustments of the VI-III flow ratio. This vastly simplifies manufacturability of doped $Ga_2O_3$, thereby enabling many applications of this important material. Moreover, it has been found that the inversion flow ratio value for this material system is about 125. That is, for VI-III flow ratios below 125, the compound semiconductor formed is p-type (silicon substitutes for oxygen, taking up two extra electrons from the lattice, thus acting as a doubly ionized acceptor to achieve very effective p-type doping). For VI-III flow ratios above 125, the compound semiconductor formed is n-type (silicon substitutes for gallium). (See FIG. 1A.) This inversion flow ratio value of 125 may be referenced, e.g., at a growth temperature of 1000° C., a pressure of 50 mbar, and $N_2$ as the carrier gas.

Figure 5A:
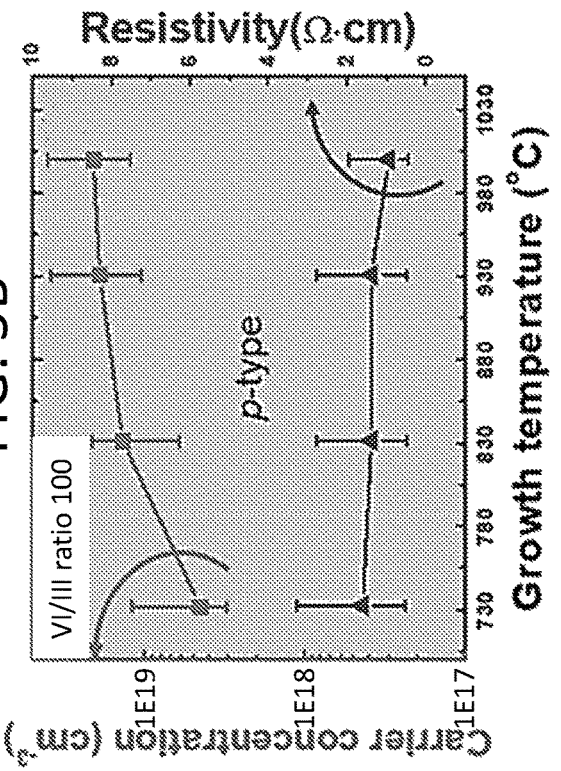
FIG. 5A shows the carrier concentration and resistivity of $Ga_2O_3$:Si on sapphire (0001) as a function of growth temperature at VI/III ratio of 150
Figure 5B:
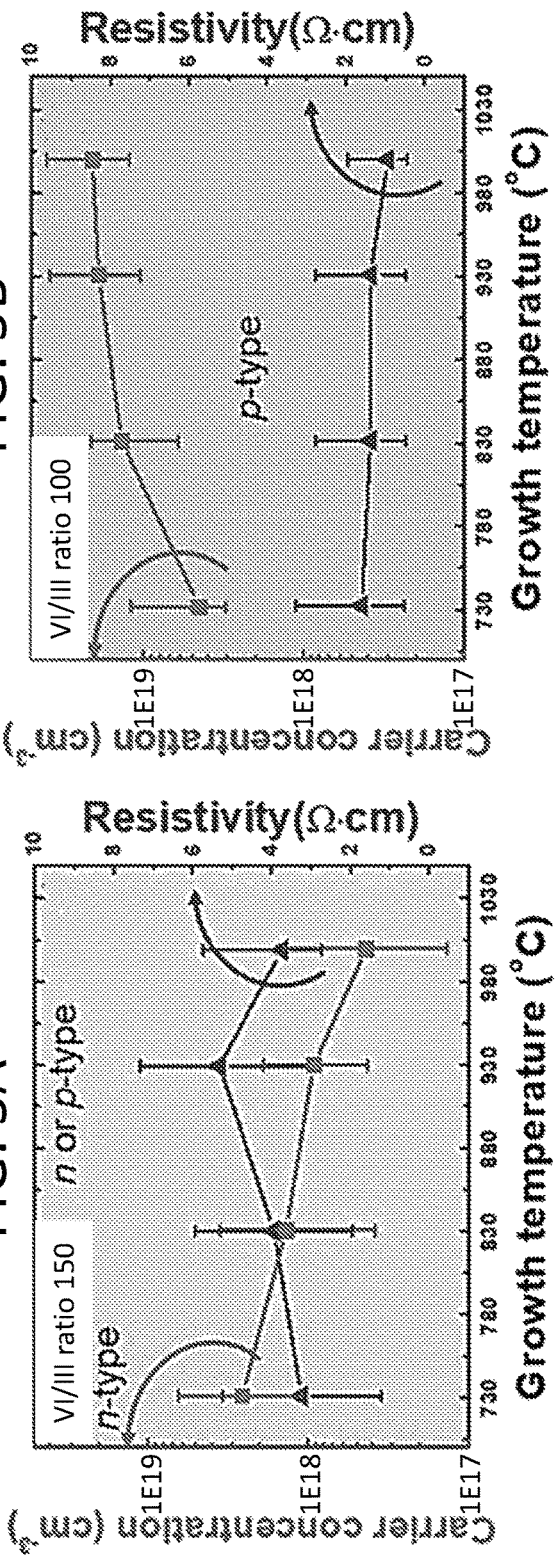
FIG. 5B shows the same at a VI/III ratio of 100.
Figure 5C:
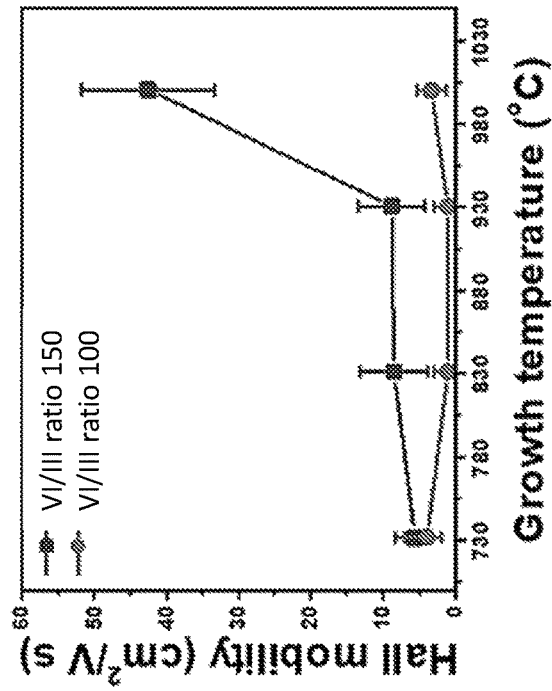
FIG. 5C shows the Hall mobility of $Ga_2O_3$:Si on sapphire (0001) as a function of growth temperature at VI/III ratio of 100 and 150.

FIGS. 5A-5C further support the findings described above. Moreover, these figures show the growth temperature does not changing the nature of doping, only the ratio of the flows of the group III and VI precursors.

Thus, the present methods may comprise carrying out the step of exposure to the vapor composition under conditions (e.g., VI-III flow ratio) selected to achieve a desired doping type (either p-type or n-type) for the IV-doped III-VI semiconductor being formed. Since both doping types may be achieved using the same group IV precursor, the methods may further comprise forming a second IV-doped III-VI semiconductor having the opposite doping type to provide a p-n heterojunction. For example, the method can be used to form an n-type IV-doped III-VI semiconductor on a p-type IV-doped III-VI semiconductor or vice versa.

With reference back to the growth temperature and pressure described above, illustrative growth temperatures include those in the range of from about 500° C. to about 1500° C., including from about 600° C. to about 1000° C., or from about 700° C. to about 1000° C. Illustrative pressures include those in the range of from about 10 mbar to about 100 mbar, including from about 50 mbar to about 150 mbar. A variety of substrates may be used in the present methods, e.g., sapphire (a-sapphire, m-sapphire, c-sapphire), $Al_2O_3$, silicon (Si(111), Si(100)), native 13-$Ga_2O_3$, MgO, ZnO, etc.

The IV-doped III-VI semiconductors formed using the present methods are also encompassed by the present disclosure. The IV-doped III-VI semiconductors may be characterized by their carrier concentrations. In embodiments, the IV-doped III-VI semiconductor is p-type having a carrier concentration in the range of from about $10^{15}$ cm$^{-3}$ to about $10^{20}$ cm$^{-3}$, from about $10^{16}$ cm$^{-3}$ to about $10^{20}$ cm', from about $10^{17}$ cm$^{-3}$ to about $10^{20}$ cm$^{-3}$ or from about $10^{18}$ cm$^{-3}$ to about $10^{20}$ cm$^{-3}$. In embodiments, the IV-doped III-VI semiconductor is n-type having a carrier concentration in any of the ranges disclosed above. The IV-doped III-VI semiconductors may be characterized by their Hall mobility. In embodiments, the Hall mobility may be in the range of from about 5 to about 300 cm$^2$/Vs, about 10 to about 300 cm$^2$/Vs, or from about 5 to about 150 cm$^2$/Vs. Known techniques may be used to measure carrier concentration and Hall mobility.

The IV-doped III-VI semiconductors may be characterized by the phase of the III-VI semiconductor. By way of illustration, for Ga$_3$O$_2$, the phase of the material may be, e.g., or K.

Also encompassed by the present disclosure are p-n heterojunctions formed from any of the disclosed p-type IV-doped III-VI semiconductor and another n-type semiconductor or from any of the disclosed p-type IV-doped III-VI semiconductors and any of the disclosed n-type IV-doped III-VI semiconductors.

Devices incorporating the IV-doped III-VI semiconductors are also encompassed by the present disclosure. Illustrative devices include photodetectors (including solar-blind UV photodetectors), field effect transistors (including fin structured transistors see FIGS. 2A-2B and 7A-7B), light emitting diodes and combinations thereof. Other applications include use of the IV-doped III-VI semiconductors in high voltage direct current transmission lines, variable frequency drives and switch mode power supplies.

Additional information regarding MOCVD, techniques for characterizing the IV-doped III-VI semiconductors, and devices in which the IV-doped III-VI semiconductors may be incorporated may be found in the Appendix I (entire document), Appendix II (especially Section 2.2 and Section 4), and Appendix III (entire document) included in U.S. Provisional Application No. 62/623,183, the entire contents of which are hereby incorporated by reference.

EXAMPLE

Example 1

A commercial horizontal-flow MOCVD reactor (AIXTRON 200/4 RF) was used to grow doped Ga$_2$O$_3$ thin films on c-plane sapphire (0001) at a growth temperature of about 1000° C. using a conventional trimethylgallium (TMGa) bubbler and high purity deionized water loaded in a custom quartz bubbler as the gallium and oxygen precursors, respectively. Silane (SiH$_4$) was used as the silicon precursor. H$_2$ was used as the carrier gas. First, TMGa was flowed for 1 minute to predeposit gallium on the substrate before introducing the water. Doped Ga$_2$O$_3$ thin films were investigated using VI/III flow ratios in the range of from 100 to 150.

FIG. 1A shows the carrier concentration as a function of the III-VI flow ratio. For VI-III flow ratios below ~125 the as-grown material is p-type (silicon substitutes for oxygen). At an VI-III flow ratio of ~125 an inversion takes place and the material becomes compensated. At an flow ratio higher than ~125 the material becomes n-type (silicon substitutes for gallium). The only aspect of the growth that was changed was the VI-III flow ratio. In all cases, the growth temperature was 1000° C. and the only variable changed was the ratio of the trimethylgallium and water flow rate being introduced into the reaction chamber. The Hall mobility of the as-grown material as a function of the VI-III flow ratio is plotted in FIG. 1B.

Figure 2B:
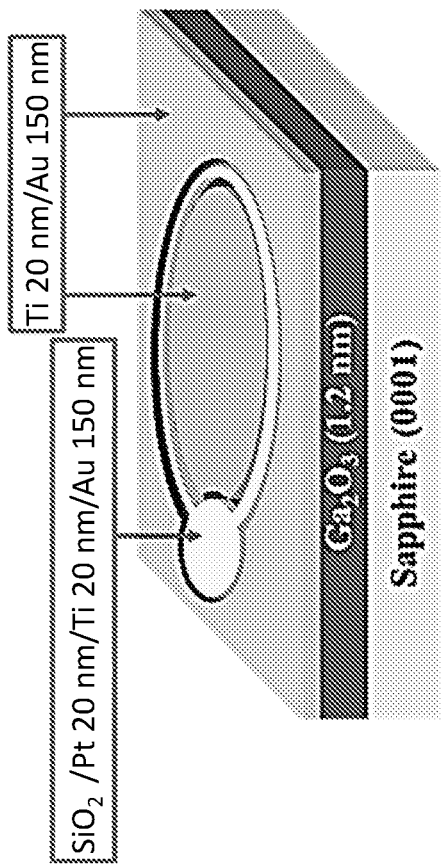
FIG. 2B shows a perspective view of the fin-FET.
Figure 2A:
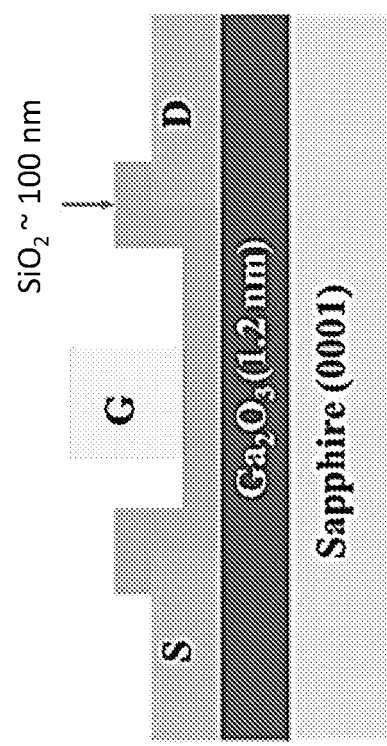
FIG. 2A shows a cross-sectional view of a schematic of a field effect transistor (FET) with a fin structure fabricated using p-type $Ga_3O_2$:Si according to an illustrative embodiment.

In order to verify that the as-grown material is indeed p-type at low VI-III flow ratios, a series of field effect transistors (FETs) with a fin structure were fabricated using the p-type material (see FIGS. 2A and 2B). An insulated gate consisting of ~100 nm of silicon dioxide was deposited over the semiconductor material (i.e., p-type Ga$_3$O$_2$) and source, drain, and gate contacts were deposited. The epitaxial layer of Ga$_2$O$_3$ was only ~1.2 nm thick. Hall mobility measurements indicated the layer was p-type with a carrier concentration of $3.423 \times 10^{18}$ cm$^{-3}$. The source-drain spacing was 20 µm and the gate was just 5 µm wide.

Figure 3A:
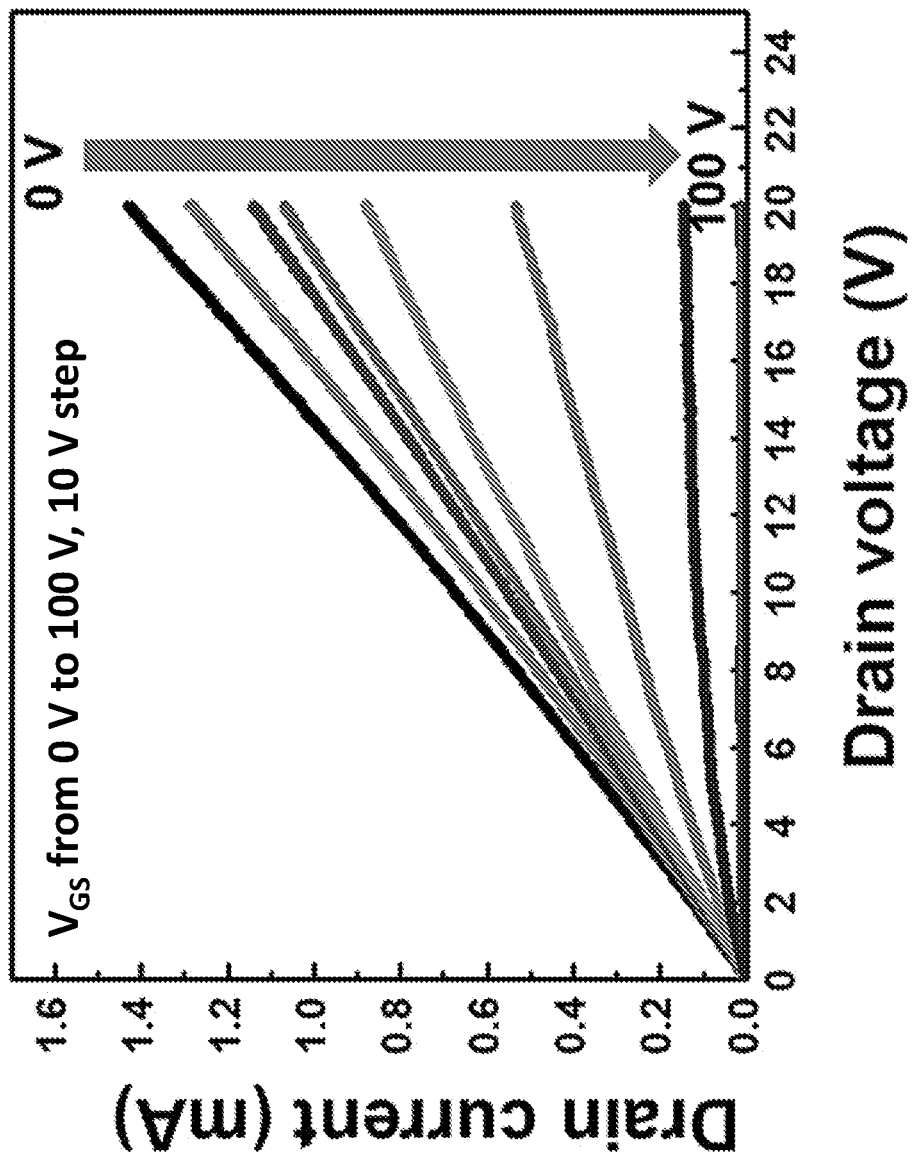
FIG. 3A is a plot of the I-V curve and FIG. 3B is a plot of the transfer characteristics at $V_{DS}=20$ V of a p-type $Ga_2O_3$:Si 3 μm by 3 μm fin array fin-FET (shown in FIGS. 2A and 2B). The fin-FET shows an on/off ratio of $10^6$ and a breakdown voltage of over 150 V.
Figure 3B:
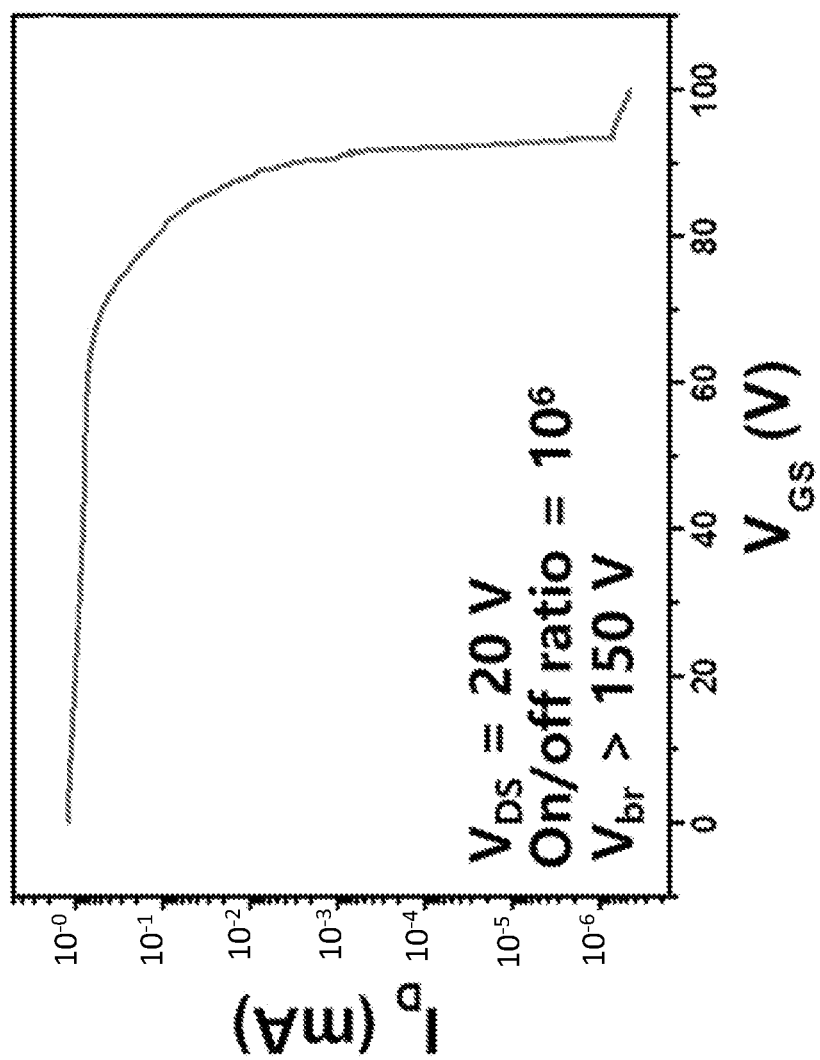

The fin-FET transistors were then experimentally characterized using an HP 4155C semiconductor parameter analyzer to measure the family of curves. The results are shown in FIGS. 3A and 3B. The measured results show the excellent conductivity of the p-type layer achieved with the novel doping technique used in this Example.

Example 2

Ga$_2$O$_3$ has emerged as a next generation semiconductor material for high power electronic devices. This is in great part due to its high breakdown electric field (~8 MV/cm), which largely surpasses that of competing materials systems such as SiC or GaN. Furthermore, the emergence of n-type doping capacity and single crystal Ga$_2$O$_3$ substrates has allowed the development of various unipolar electronic devices including metal oxide semiconductor field effect transistors (MOSFETs), Schottky diodes, metal semiconductor field effect transistors (MESFET).[1-3] The vast majority of this work has focused on homoepitaxial growth of monoclinic β-Ga$_2$O$_3$, which is the most stable of five common polymorphs (α, β γ, δ and ε). A major drawback of Ga$_2$O$_3$ till present, however, has been lack of a method to obtain p-type conduction. This is a key limitation for its adoption in a whole range of semiconductor device applications. Moreover, the relatively low thermal conductivity of Ga$_2$O$_3$ and the problem of Ga$_2$O$_3$ substrate cost being two orders of magnitude higher than sapphire are both currently hindering the fuller development of Ga$_2$O$_3$ based power electronics.

κ-Ga$_2$O$_3$ (an orthorhombic polymorph which is normally considered to be transient) can be stabilized in heteroepitaxial growth on sapphire (0001) substrates by MOCVD[4]. In this Example, it is shown that high levels of shallow acceptor p-type conduction may be achieved in such layers using silicon impurity doping under Ga rich growth conditions. 2D layers of such p-type Ga$_2$O$_3$:Si are then processed into microstrip array ring FETs using conventional photolithography. The operational characteristics of the FETs proved to be consistent with p-type conduction. This is the first demonstration of both shallow acceptor doping of Ga$_2$O$_3$ and a p-type Ga$_2$O$_3$ channel FET. A phenomenological model coherent with a p-type channel is also presented.

A commercial MOCVD reactor (AIXTRON 200/4 RF) was used to grow Ga$_2$O$_3$ on sapphire (0001) substrates at growth temperatures ranging from 730 to 1000° C. Trimethylgallium (TMGa), high purity deionized water and SiH$_4$ were adopted as the Ga, 0 and Si precursors, respectively. N$_2$ was used as the carrier gas. Total pressure was 50 mbar. VI/III ratio was either 100 (Ga-rich) or 150 (0-rich). The SiH$_4$ flow rate was fixed at 15 sccm.

As shown in FIG. 4A, XRD analysis was performed to analyze the phases of the grown ~150 nm thick Ga$_2$O$_3$:Si with different VI/III ratio 100 and 150 (top and middle). The XRD results show three peaks for each $Ga_2O_3$:Si layer. These three peaks were observed, similar to the results of the β-$Ga_2O_3$ substrate (bottom). However the TEM analysis in FIG. 4B showed the result of κ-phase with the space group of $Pna^21$.[4] The κ-phase $Ga_2O_3$:Si was grown in the (002) direction and the 6 rotated domains were observed in the ~150 nm thick $Ga_2O_3$:Si.

Electrical properties were measured using Van der Pauw Hall measurements. Ohmic contacts were obtained using a Ga/In eutectic. FIGS. 5A and 5B show the results as a function of growth temperature for both VI/III ratios. At a VI/III ratio of 150, $Ga_2O_3$:Si grown at 730° C. shows n-type characteristics. As growth temperature was increased from 730° C. to 1000° C., the carrier concentration decreased linearly to ~$4.4 \times 10^{17}$ $cm^{-3}$. FIG. 5B shows that the lower VI/III ratio (100) consistently gave p-type characteristics. Assuming that the Si dopant acts as a shallow acceptor by substituting on the O-site of the $Ga_2O_3$, the VI/III ratio of 100 growth condition would generate a higher density of oxygen vacancies ($V_O$) by virtue of the Ga-rich nature of the growth which lets the Si substitute more readily at the O-sites. This assumption is consistent with FIG. 2C which shows the Hall mobility of the $Ga_2O_3$:Si as a function of growth temperature for VI/III ratios of 150 and 100. For a VI/III ratio of 150, a (n-type) mobility near 50 $cm^2$/Vs was observed for a growth temperature of 1000° C. For a VI/III ratio of 100, a p-type mobility of ~3.3 $cm^2$/Vs was observed. This demonstrates Si is acting as an amphoteric dopant in κ-$Ga_2O_3$. Si impurity doping is generally incorporated so as to substitute for Ga where it acts as a shallow donor so as to create heavily doped n-type $Ga_2O_3$. But as the density of $V_O$ increases under Ga-rich growth conditions, the above results suggest that Si can act as a shallow acceptor by substituting on the O-sites in κ-$Ga_2O_3$, and thus promote a transformation to predominantly p-type conduction. These p-type results were confirmed via multiple independent measurements.

Figure 6:
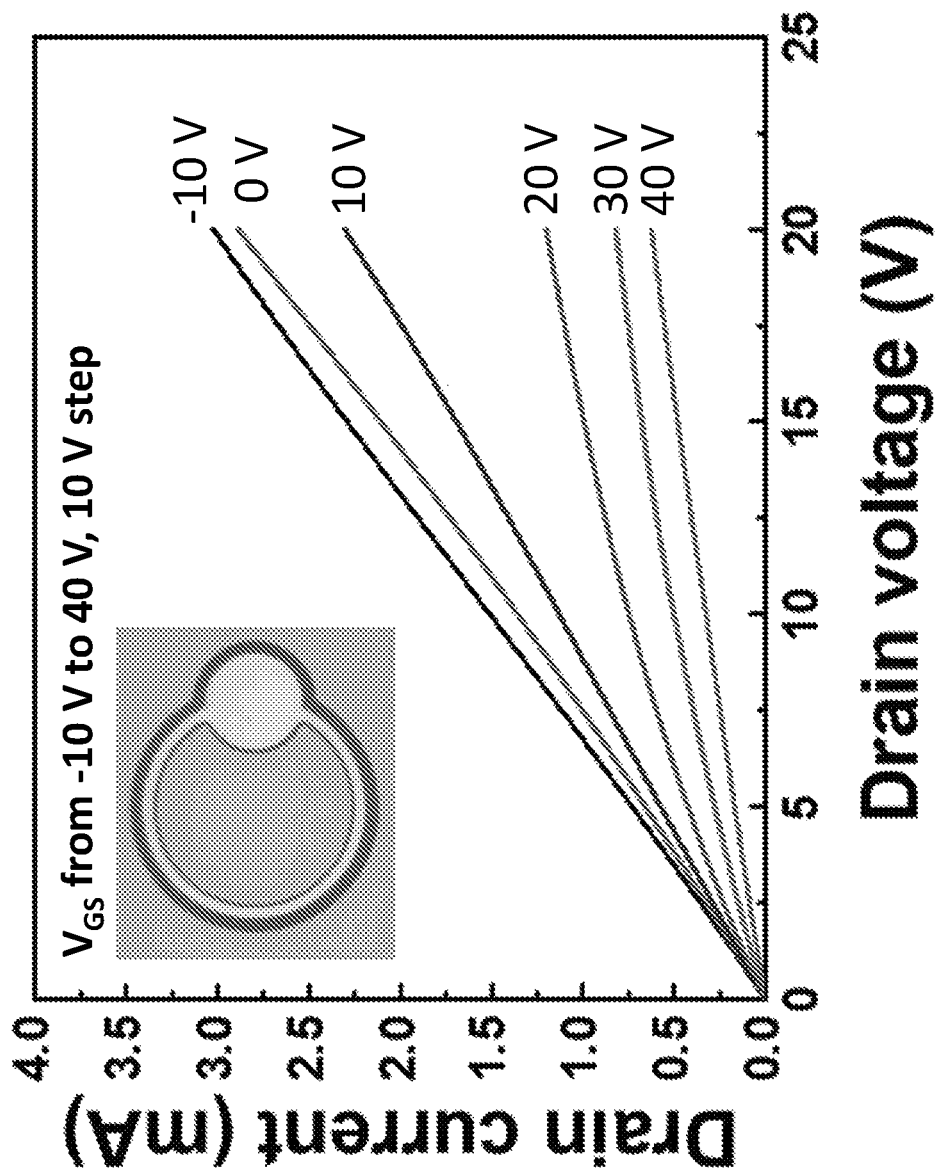
FIG. 6 shows I-V curves of ~150 nm thick p-type $Ga_2O_3$:Si on sapphire (0001) from $V_{GS}=-10$ to 40 V and the inset is an optical microscope image of the fabricated device.

Ring type FETs were fabricated and evaluated for the characteristics of the FET device of ~150 nm thick p-type $Ga_2O_3$:Si with VI/III ratio of 100. FIG. 6 shows the I-V curves. It is observed that the drain current decreases with increasing gate voltage. However, it was not possible to achieve pinch-off due to the gate electrode burning at gate voltages higher than 50 V. To avoid this issue the channel thickness was reduced to ~1.2 nm and the ring pattern FETs were patterned with microstrips. $Ga_2O_3$:Si channel layers were grown at 1000° C. with a VI/III ratio of 100. The channel thickness was estimated to be ~1.2±0.5 nm based on interferometric growth rate calibration and AFM step-edge profilometry. Hall measurements confirmed the p-type nature of the layers with a resistivity of ~0.007 Ω·cm, a carrier concentration of ~$1.7 \times 10^{20}$ cm' and a mobility of ~5.7 $cm^2$/V·s.

Figure 7B:
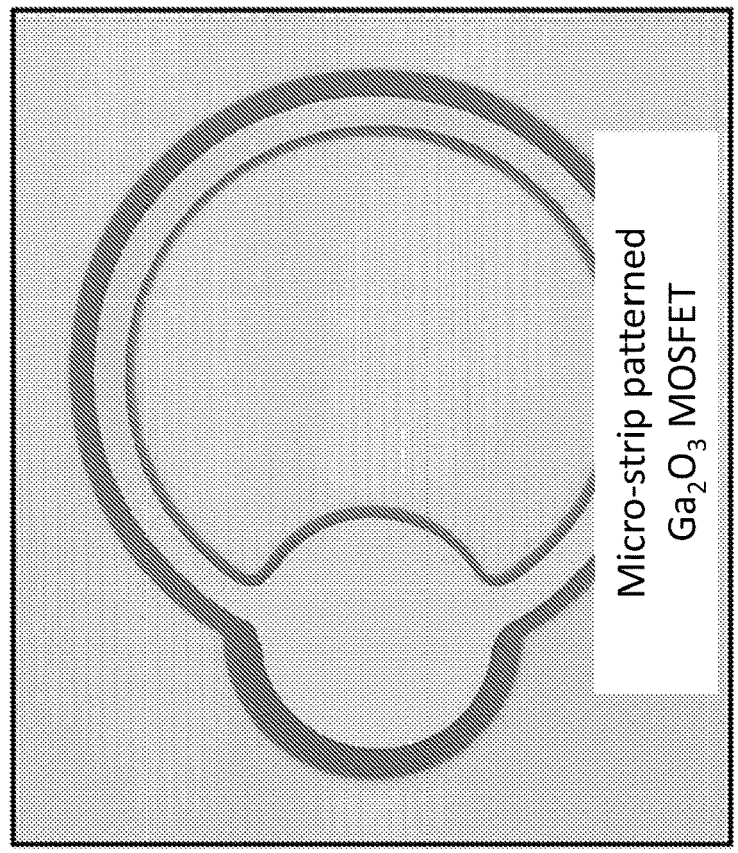
FIG. 7B shows an optical micrograph of the fabricated device.
Figure 7A:
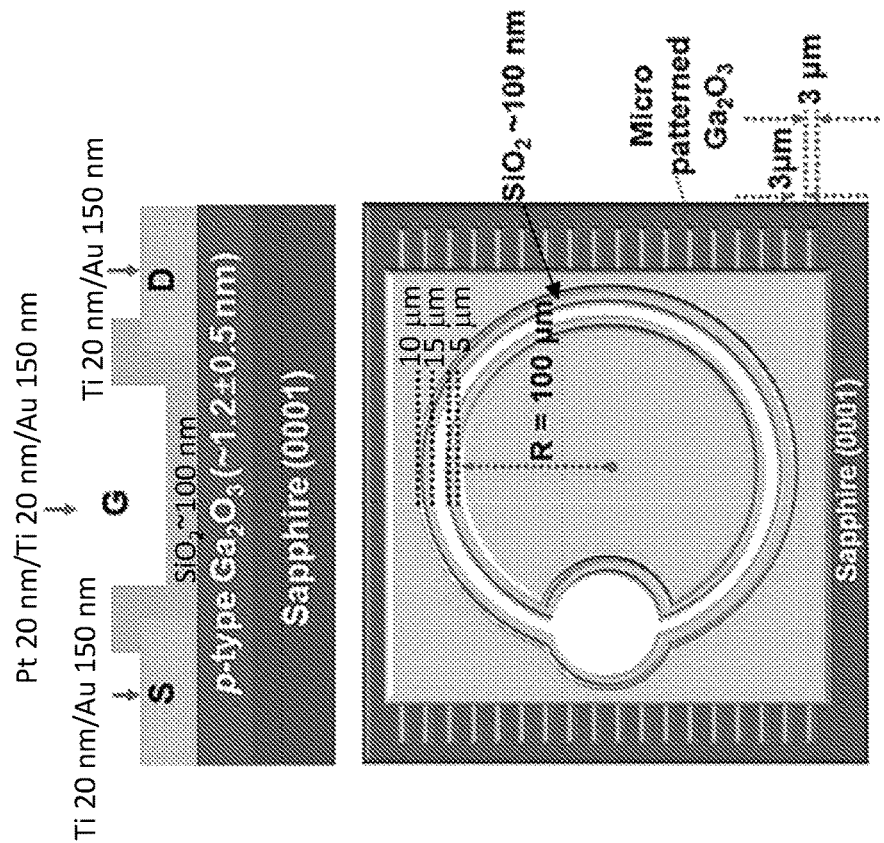
FIG. 7A show schematic illustrations of 2D p-type $Ga_2O_3$:Si channel microstrip array FETs with details of device scale

Standard photolithography and lift-off were employed to deposit source and drain metal contacts. Before their deposition, 3 μm×3 μm microstrip patterns were formed by electron cyclotron resonance-reactive ion etching (ECR-RIE) with $CF_4$ for 5 minutes. The metal contacts were Ti (20 nm)/Au (150 nm) deposited by e-beam evaporation. $SiO_2$ of 100 nm thick gate dielectric material was formed by plasma-enhanced chemical vapor deposition (PECVD). After dielectric and passivation film deposition, the gate metal contact was formed with Pt(20 nm)/Ti(20 nm)/Au(150 nm) on the $SiO_2$ film. The gate length, and the spacing between the source/drain and the inside source circular pad were 15, 20 and 100 μm, respectively. FIG. 7A shows schematic illustrations of the device with top- and cross-sectional views illustrating the device scale. FIG. 7B shows an optical microscope image of the fabricated device.

Figure 8A:
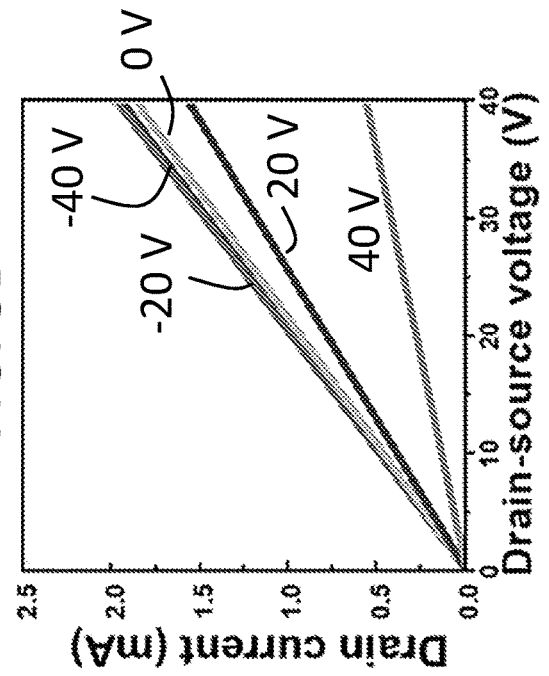
FIG. 8A shows I-V curves from $V_{GS}=-50$ to 100 V. The inset is an optical micrograph of the probing.
Figure 8B:
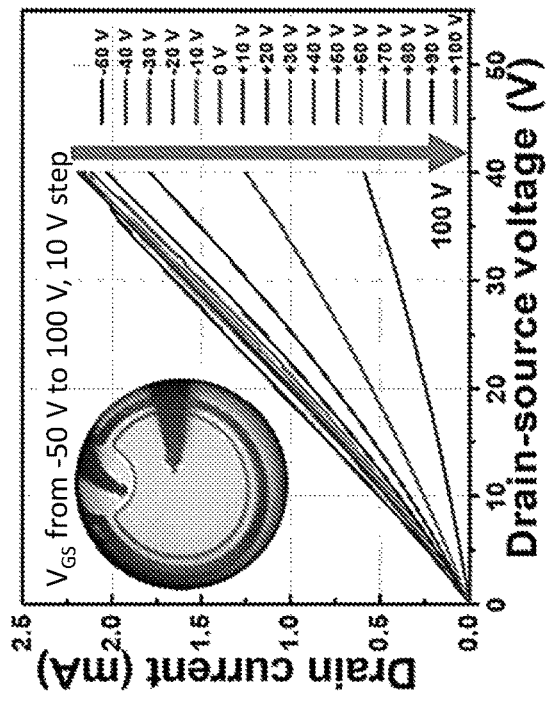
FIG. 8B shows simulation data of I-V curves from $V_{GS}=-40$ to 40 V.
Figure 8C:
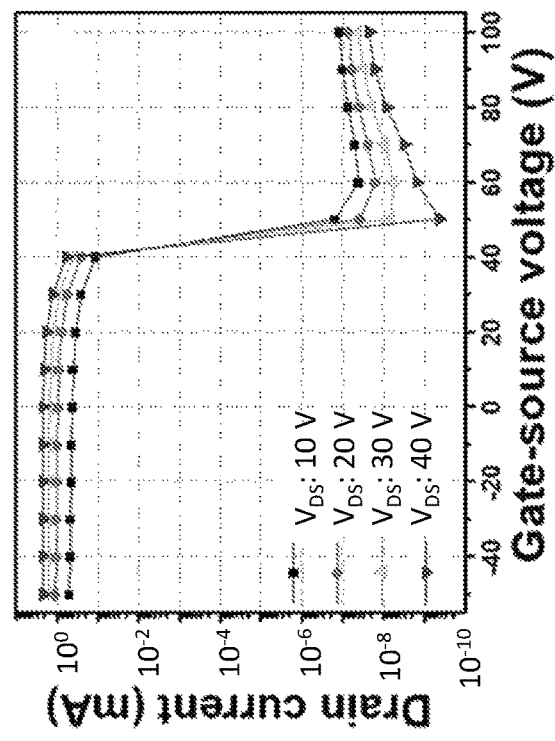
FIG. 8C shows transfer characteristics at $V_{DS}=10$ to 40 V.

Next, the FETs were fabricated and tested using a semiconductor parameter analyzer and probe station. FIG. 8A shows the DC source-drain current versus source-drain voltage ($I_{DS}$–$V_{DS}$) output characteristics for the depletion-mode FETs measured by increasing gate-source voltage ($V_{GS}$) stepwise from −50 to 100 V. The maximum $I_{DS}$ was 2.19 mA and it was effectively modulated by $V_{GS}$ from −50 to 100 V, which is consistent with a p-type channel. Because of the heavy p-doping, the 2D microstrip channel is normally-on, and the channel off-state was observed for a gate bias of 50 V ($I_{DS}$=0.1 pA at $V_{DS}$ of 40 V). In addition, because of the high sheet resistance, even with a drain voltage as high as 40 V, the voltage drop in the FET channel is still lower than $|V_G - V_T|$, which is the condition for current saturation in long channel FETs. So the $I_{DS}$–$V_{DS}$ characteristics remain linear. FIG. 8B displays a similar set of curves obtained from the simulation. It can be seen that the theoretical model is consistent with the experimental data in showing an output resistance increase with positive gate voltage, and $I_{DS}$ bunching with little variation of the output resistance for $V_{GS}$<0. This is also consistent with a p-type channel. FIG. 8C shows transfer characteristics at $V_{DS}$ of 10 to 40 V in a logarithmic scale. The device achieved an on/off ratio of ~$10^8$ by minimizing the thickness and width of the channel. A plot of the gate current as a function of drain-source voltage (not shown) showed that $I_G$ increases above a $V_{GS}$ of 50 V because of a gate leakage current. It is expected that the on/off ratio can be further improved through optimization of the dielectric layer.

Figure 9B:
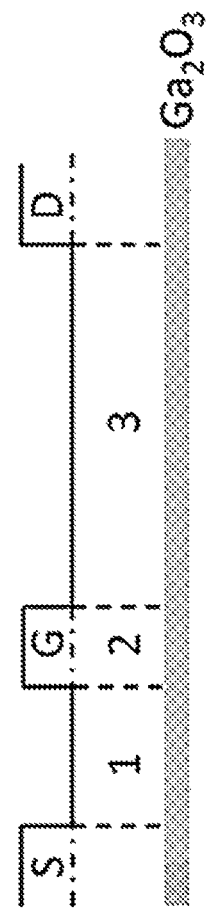
FIG. 9B shows a schematic illustration of three portions of the $Ga_2O_3$ channel.
Figure 9A:
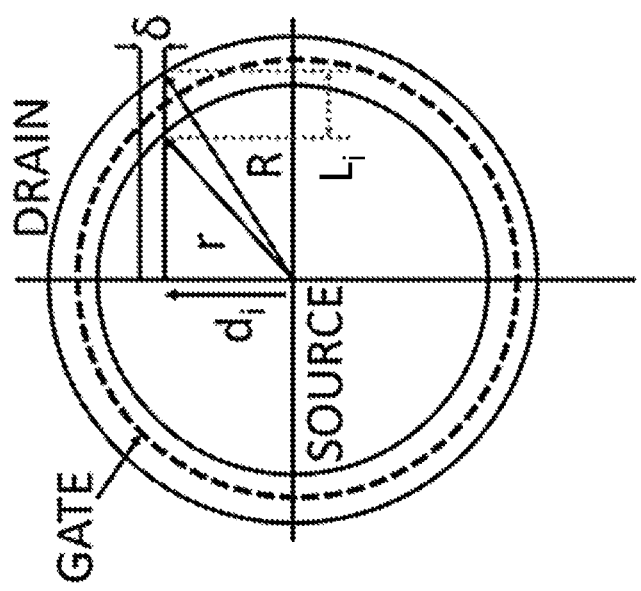
FIG. 9A shows a schematic illustration of the 2D $Ga_2O_3$:Si channel microstrip array FETs.

A phenomenological model was developed based on the device configuration displayed in FIGS. 7A-7B. FIGS. 9A-9B show the schematic of the model device that consists of a linear array of δ=3 μm wide micro-strips separated from each other by δ=3 μm. They are covered by a disk-shaped source contact of 200 μm in diameter, and separated from a square shaped drain by a 30 μm wide circular channel. So, in each quadrant, the channel length, $L_i$, varies between a minimum value when it is perpendicular to the disk and a maximum value when it is tangential to the disk. The position of the $i^{th}$ microstrip is identified by its distance, $d_i$, from the center of the source disk.

At $V_G$=0 V, the channel is uniform and the current between source and drain in the $i^{th}$ micro-strip channel is given by $$I_i = e p_S \delta v_i \qquad (1)$$

where e is the electron charge (C), $p_S$ is the 2D hole concentration (carriers/$cm^2$), δ the wire width (cm) and $v_i$ is the hole velocity in the $i^{th}$ channel (cm/s). In the absence of saturation velocity (long channel-low mobility), $$v_i = \frac{\mu V_{DS}}{L_i} \qquad (2)$$

where μ is the hole mobility ($cm^2$/Vs) and $L_i$ is the channel length (cm).

If $d_i$=2iδ with 0<i<N, Equ. 1 becomes for top and bottom right quadrants $$I_{right} = 2\Sigma_{i=0}^N I_i = e p_S \mu V_{DS} \Sigma_{i=0}^N 1/[\sqrt{(N+5)^2 - i^2} - \sqrt{N^2 - i^2}] = 2.84 e p_S \mu V_{DS} \qquad (3)$$

Because of the relatively big gate pad on the left side of the source, channel lengths are longer for a sizeable portion of the FIN-microstrips, so it is estimated that the total current should be multiplied by a factor η~1.8-1.9<2. Finally, $$I = I_{Right} + I_{Left} = \eta I_{Right} \qquad (4)$$

At $V_G \neq 0$, the channel is made of three portions with different conductances (FIG. 9B). By neglecting the contact resistance, for each channel, $$I_i(V_G) = \frac{V_{DS}}{\frac{1}{G_1^i} + \frac{1}{G_2^i} + \frac{1}{G_3^i}} \text{ with} \qquad (5)$$

$$G_{1,3}^i = \frac{ep_S(V_G = 0)\delta\mu}{L_{1,3}^i} \quad G_2^i = \frac{ep_S(V_G \neq 0)\delta\mu}{L_2^i}$$

If $$p_S(V_G \neq 0) = p_S(V_G = 0)\exp\left(-\frac{eV_C}{kT}\right),$$

where $V_C(V_G)$ is the channel potential induced by the gate bias, the expression for the current reads $$I_i(V_G) = ep_S(V_G = 0)\delta\mu V_{DS}/(L_1^i + L_2^i \exp(eV_C/kT) + L_3^i) \qquad (6)$$

or after summation over all channels, $$I(V_G) = \frac{2I(V_G = 0)}{1 + \exp\left(\frac{eV_C}{kT}\right)} \qquad (7)$$

This equation shows that for $V_C < 0$ ($V_G < 0$) the drain current decreases, whereas for $V_C > 0$ ($V_G > 0$) the drain current increases in agreement with the experimental data. This is consistent with the channel being p-type. In quantitative terms, it shows that current decreases by several orders of magnitude under positive $V_G$ compared to a limiting increase by a factor 2 under negative $V_G$. This asymmetry in the variation of the I-V characteristics for $V_G < 0$ and $V_G > 0$ is also consistent with the experimental data.

From the Poisson equation, one can derive an expression of $V_C$ for intermediate gate bias:

$$V_C(y) = \frac{V_G \lambda_D \exp\left(-\frac{y-D}{\lambda_D}\right)}{D + \lambda_D} \qquad (8)$$

where D is the thickness of the SiO$_2$ barrier, y is the vertical coordinate inside the Ga$_2$O$_3$ layer, and $\lambda_D$ is the Debye length in the Ga$_2$O$_3$ layer fitted to reproduce the experimental I-V characteristics. FIG. 8B displays simulation data of I-V curves from $V_{GS} = -40$ to 40 V, for which a channel mobility $\mu = 23$ cm$^2$/Vs and hole concentration $p_S = 2.35 \times 10^{12}$/cm$^2$ was used.

In conclusion, κ-Ga$_2$O$_3$:Si layers grown on sapphire (0001) substrates by MOCVD showed consistent p-type Hall signal for layers grown with lower VI/III ratios during growth. Room temperature mobilities were up to 7 cm$^2$/Vs, resistivities were as low as 0.007 Ω·cm and carrier concentrations were up to ~10$^{20}$ cm$^{-3}$ for thinner layers. Ring mesa FETs were fabricated based on ~1.2 nm thick p-Ga$_2$O$_3$:Si channels formed into a number of 3 μm wide microstrips. The devices achieved a maximum drain current density of 2.19 mA and an on/off ratio of ~10$^8$ and showed characteristics consistent with a p-type conduction in the channel.

The p-type Ga$_2$O$_3$ demonstrated in this Example represents a significant advance in the state of the art, which may herald the fabrication of a range of p-n junction based devices. These may be smaller/thinner and bring both cost (more devices/wafer and less growth time) and operating speed advantages (due to miniaturisation) than current isotype FETs. Moreover the demonstration of the first functioning devices based on scaling down to 2D device channels in Ga$_2$O$_3$ based FETs opens up the perspective of faster devices and improved heat evacuation.

REFERENCES FOR EXAMPLE 2

[1] M. Higashiwaki, K. Sasaki, T. Kamimura, M. Hoi Wong, D. Krishnamurthy, A. Kuramata, T. Masui, and S. Yamakoshi, Appl. Phys. Lett. 103, 123511 (2013).
[2] K. Sasaki, M. Higashiwaki, A. Kuramata, T. Masui, and S. Yamakoshi, J. Cryst. Growth 378, 591 (2013).
[3] K. Sasaki, DaikiWakimoto, Q. T. Thieu, Y. Koishikawa, A. Kuramata, M. Higashiwaki, and S. Yamakoshi, IEEE Electron Device Lett. 38, 783 (2017).
[4] M. Razeghi, J.-H. Park, R. McClintockl, D. Pavlidis, F. H. Teherani, D. J. Rogers, B. A. Magill, G. A. Khodaparast, Y. Xu, J. Wu, and V. P. Dravid, Proc. SPIE 10533, 105330R (2018).
[5] A. Munoz-Yague and S. Baceiredo, J. Electrochem. Soc. 129, 2108 (1982).
[6] I. TERAMOTO, J. Phys. Chem. Solids 33, 2089 (1972).
[7] H. P. Meier, R. F. Broom, P. W. Epperlein, E. van Giesen, C. Harder, and H. Jackel, J. Vac. Sci. Technol. B 6, 692 (1988).
[8] K. Agawa, K. Hirakawa, N. Sakamoto, Y. Hashimoto, and T. Ikoma, Appl. Phys. Lett. 65, 1171 (1994).
[9] A. A. Quivy, A. L. Sperandio, E. C. F. Silva, and J. R. Leite, J. Cryst. Growth 206, 171 (1999).
[10] T. Oishi, Y. Koga, K. Harada, and M. Kasu, Appl. Phys. Express 8, 031101 (2015).
[11] M. Baldini, M. Albrecht, A. Fiedler, K. Irmscher, R. Schewski, and G. Wagner, ECS J. Solid State Sci. Technol. 6, Q3040 (2017).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A method of forming a p-type IV-doped III-VI semiconductor, the method comprising:

exposing a substrate to a vapor composition comprising a group III precursor comprising a group III element, a group VI precursor comprising a group VI element, and a group IV precursor comprising a group IV element, under conditions to form a p-type IV-doped III-VI semiconductor via metalorganic chemical vapor deposition (MOCVD) on the substrate.

2. The method of claim 1, wherein the conditions comprise use of a flow ratio defined as a flow rate of the group VI precursor to a flow rate of the group III precursor and the flow ratio is below an inversion flow ratio value for the IV-doped III-VI semiconductor so as to provide the p-type IV-doped III-VI semiconductor.

3. The method of claim 1, further comprising exposing the substrate to the vapor composition under conditions to form an n-type IV-doped III-VI semiconductor via MOCVD from the vapor composition.

4. The method of claim 3, wherein the conditions comprise use of a flow ratio defined as a flow rate of the group VI precursor to a flow rate of the group III precursor and the flow ratio is above an inversion flow ratio value for the IV-doped III-VI semiconductor so as to provide the n-type IV-doped III-VI semiconductor.

5. The method of claim 1, wherein the conditions comprise use of a first flow ratio defined as a flow rate of the group VI precursor to a flow rate of the group III precursor to provide the p-type IV-doped III-VI semiconductor;

wherein the method further comprises exposing the substrate to the vapor composition under conditions to form an n-type IV-doped III-VI semiconductor via MOCVD from the vapor composition, wherein the conditions comprise use of a second, different flow ratio to provide the n-type IV-doped III-VI semiconductor.

6. The method of claim 1, wherein the group III precursors are selected from a Ga-containing group III precursor, an Al-containing group III precursor, an In-containing group III precursor and combinations thereof.

7. The method of claim 1, wherein the group IV precursor comprises Si.

8. The method of claim 1, wherein the vapor composition further comprises a carrier gas comprising $N_2$, $H_2$, Ar, or combinations thereof.

9. The method of claim 1, wherein the group III precursors are selected from a Ga-containing group III precursor, an Al-containing group III precursor, an In-containing group III precursor and combinations thereof; wherein the group VI precursor comprises O; and wherein the group IV precursor comprises Si.

10. The method of claim 9, wherein the vapor composition further comprises a carrier gas comprising $N_2$.

11. A method of forming a p-type IV-doped III-VI semiconductor, the method comprising:

exposing a substrate to a vapor composition comprising a group III precursor comprising a group III element, a group VI precursor comprising a group VI element, and a group IV precursor comprising a group IV element, under conditions to form a p-type IV-doped III-VI semiconductor via metalorganic chemical vapor deposition (MOCVD) on the substrate, further comprising exposing the substrate to the vapor composition under conditions to form an n-type IV-doped III-VI semiconductor via MOCVD from the vapor composition, wherein the n-type IV-doped III-VI semiconductor is in contact with the p-type IV-doped III-VI semiconductor, thereby forming a p-n heterojunction.

12. A method of forming a p-type IV-doped III-VI semiconductor, the method comprising:

exposing a substrate to a vapor composition comprising a group III precursor comprising a group III element, a group VI precursor comprising a group VI element, and a group IV precursor comprising a group IV element, under conditions to form a p-type IV-doped III-VI semiconductor via metalorganic chemical vapor deposition (MOCVD) on the substrate, wherein the conditions comprise use of a first flow ratio defined as a flow rate of the group VI precursor to a flow rate of the group III precursor to provide the p-type IV-doped III-VI semiconductor;

wherein the method further comprises exposing the substrate to the vapor composition under conditions to form an n-type IV-doped III-VI semiconductor via MOCVD from the vapor composition, wherein the conditions comprise use of a second, different flow ratio to provide the n-type IV-doped III-VI semiconductor, wherein the n-type IV-doped III-VI semiconductor is in contact with the p-type IV-doped III-VI semiconductor, thereby forming a p-n heterojunction.

13. A method of forming a p-type IV-doped III-VI semiconductor, the method comprising:

exposing a substrate to a vapor composition comprising a group III precursor comprising a group III element, a group VI precursor comprising a group VI element, and a group IV precursor comprising a group IV element, under conditions to form a p-type IV-doped III-VI semiconductor via metalorganic chemical vapor deposition (MOCVD) on the substrate, wherein the group III precursors are selected from a Ga-containing group III precursor, an Al-containing group III precursor, an In-containing group III precursor and combinations thereof; wherein the group VI precursor comprises O; and wherein the group IV precursor comprises Si, wherein the p-type IV-doped III-VI semiconductor formed is p-type Si-doped $Ga_2O_3$ or p-type Si-doped $(Ga,In)_2O_3$.

14. A p-n heterojunction comprising a layer of an n-type semiconductor in contact with a p-type IV-doped III-VI semiconductor comprising a group III element, a group VI element and a group IV element, wherein the n-type semiconductor is an n-type IV-doped III-VI semiconductor comprising the group III element, the group VI element and the group IV element.

15. The p-n heterojunction of claim 14, wherein the group III element is selected from Ga, Al, In, and combinations thereof; the group VI element is O, and the group IV element is Si.

16. A IV-doped III-VI semiconductor comprising a group III element, a group VI element and a group IV element, wherein the semiconductor is p-type.

17. A p-n heterojunction comprising a layer of an n-type semiconductor in contact with the p-type IV-doped III-VI semiconductor of claim 16.

18. The p-n heterojunction of claim 17, wherein the group III element is selected from Ga, Al, In, and combinations thereof; the group VI element is O, and the group IV element is Si.

19. A device comprising the p-type IV-doped III-VI semiconductor of claim 16 and another material layer in contact with the p-type IV-doped III-VI semiconductor.

20. The device of claim 19, wherein the group III element is selected from Ga, Al, In, and combinations thereof; the group VI element is O, and the group IV element is Si.

21. The IV-doped III-VI semiconductor of claim 16, wherein the group III element is selected from Ga, Al, In, and combinations thereof; the group VI element is O, and the group IV element is Si.

22. A IV-doped III-VI semiconductor comprising a group III element, a group VI element and a group IV element, wherein the semiconductor is Si-doped $Ga_2O_3$ or Si-doped $(Ga,In)_2O_3$, wherein the semiconductor is K-phase.

23. The IV-doped III-VI semiconductor of claim 22 in contact with a $\beta$-$Ga_2O_3$ substrate.

24. A device comprising the IV-doped III-VI semiconductor of claim 22 and another material layer in contact with the IV-doped III-VI semiconductor.

\* \* \* \* \*